(12) United States Patent
Chang

(10) Patent No.: US 6,933,761 B2
(45) Date of Patent: Aug. 23, 2005

(54) TECHNIQUES FOR DYNAMICALLY SELECTING PHASES OF OSCILLATOR SIGNALS

(75) Inventor: Richard Chang, East Palo Alto, CA (US)

(73) Assignee: Altera Corporation, San Jose, CA (US)

( * ) Notice: Subject to any disclaimer, the term of this patent is extended or adjusted under 35 U.S.C. 154(b) by 35 days.

(21) Appl. No.: 10/600,120

(22) Filed: Jun. 20, 2003

(65) Prior Publication Data

US 2004/0257137 A1 Dec. 23, 2004

(51) Int. Cl.⁷ .............................................. H03H 11/16
(52) U.S. Cl. ...................................... 327/231; 327/276
(58) Field of Search ................................ 327/231, 261, 327/262, 269, 270, 276, 152, 153, 158, 161

(56) References Cited

U.S. PATENT DOCUMENTS

| 5,059,924 | A | | 10/1991 | JenningsCheck ............ 331/1 A |
| 5,744,991 | A | | 4/1998 | Jefferson et al. ............ 327/158 |
| 6,157,694 | A | * | 12/2000 | Larsson ........................ 377/48 |
| 6,326,812 | B1 | | 12/2001 | Jefferson ....................... 326/93 |
| 6,369,624 | B1 | | 4/2002 | Wang et al. .................. 327/156 |
| 6,515,508 | B1 | | 2/2003 | Chang et al. .................. 326/38 |
| 6,549,045 | B1 | | 4/2003 | Wang et al. .................. 327/115 |
| 6,580,304 | B1 | * | 6/2003 | Rieven ........................ 327/276 |
| 6,600,355 | B1 | * | 7/2003 | Nguyen ....................... 327/298 |
| 2002/0126785 | A1 | * | 9/2002 | Maggio et al. ............. 375/373 |
| 2003/0234669 | A1 | * | 12/2003 | Foley et al. ................. 327/107 |

* cited by examiner

*Primary Examiner*—Linh My Nguyen
(74) *Attorney, Agent, or Firm*—Townsend and Townsend and Crew LLP; Steven J. Cahill

(57) ABSTRACT

Techniques for dynamically shifting the phase of clock signals are provided. A circuit generates a plurality of periodic clock signals. Each clock signal has the same period, the same duty cycle, and a different phase. The clock signals are provided to the inputs of two multiplexers. The output signals of the multiplexers are transmitted to a phase selection circuit that generations phase selection signals. The multiplexers each select one of the clock signals in response to the phase selection signals. When the phase selection signals change value, each multiplexer selects a different clock signal in order to shift the phase of its output signal forward or backward by an incremental value. A directional signal determines whether the multiplexers shift the phases of their output signals forward or backward in time.

33 Claims, 4 Drawing Sheets

TECHNIQUES FOR DYNAMICALLY SELECTING PHASES OF OSCILLATOR SIGNALS

BACKGROUND OF THE INVENTION

The present invention relates to the field of electronic circuits, and more particularly, to techniques for dynamically shifting the phase of clock signal by incremental values.

A phase-locked loop (PLL) is a circuit that measures variations in the phase of an input clock signal. A PLL operates by adjusting the phase of a periodic signal generated by an oscillator. The PLL aligns the phase of the oscillator signal with the phase of the input clock signal. Variations in the phase of the oscillator signal track variations in the phase of the input clock signal. When the phase of the oscillator signal and the input signal are perfectly aligned, the two signals are said to be in lock. The output signal of the PLL is generated from the oscillator signal.

Certain applications for PLLs and DLLs would benefit from being able to dynamically change the phase of a clock signal. For example, some applications would benefit from being able to dynamically increase or decrease the delay of a clock signal. Sampling circuits would benefit from being able to dynamically sweep the phase of the clock signal to locate optimal sampling points. Fractional frequency dividers would also benefit from being able to shift the phase of the clock signal dynamically. Many of these applications require that the circuitry remain ON while the phase of the clock signal is shifted.

Therefore, it would be desirable to provide circuitry that allows the phase of an clock signal to be shifted dynamically, while the circuitry is ON. It would also be desirable to provide dynamic phase shift selection circuitry for clock signals generated by PLL and DLL circuits.

BRIEF SUMMARY OF THE INVENTION

The present invention provides circuits and methods for dynamically selecting the phase of a clock signal. A circuit of the present invention can dynamically shift the phase of a clock signal while the circuit is ON in normal operational mode, without resetting the circuit. A circuit of the present invention can shift the phase of a clock signal without generating unwanted glitches in the clock signal.

According to the present invention, clock circuitry generates a plurality of periodic clock signals. Each clock signal has the same period, the same duty cycle, and a different phase. The phase of the clock signals are equally spaced with respect to the phases of adjacent clock signals.

The clock signals are provided to the inputs of two multiplexers. The output signals of the multiplexers are transmitted to a phase selection circuit that generates phase selection signals. The multiplexers each select one of the clock signals in response to the phase selection signals. When the phase selection signals change value, each multiplexer selects a different one of the clock signals in order to shift the phase of its output signal forward or backward in time by an incremental value. A directional signal determines whether the multiplexers shift the phases of their output signals forward or backward. If the clock circuitry generates N clock signals, the multiplexers can shift the phases of their output signals by 360°/N in one cycle.

Other objects, features, and advantages of the present invention will become apparent upon consideration of the following detailed description and the accompanying drawings, in which like reference designations represent like features throughout the figures.

DETAILED DESCRIPTION OF THE INVENTION

Many types of circuits such as phase locked loops (PLL) and delay locked loops (DLL) have a need to dynamically shift the phase of a clock signal. The present invention provides a dynamic phase shift feature for clock signals. Techniques of the present invention can be used to shift the phase of a clock signal generated by a PLL or DLL. The phase of a clock signal can be shifted by incremental steps. Each step can be a fixed percentage of the clock period.

Having an on-chip PLL or DLL is an important feature in integrated circuits such as programmable logic devices (PLDs) and FPGAs. A PLL can be used to improve circuit performance and to generate clock signals with different frequencies. The required phase of the output clock signal varies depending on the application. The present invention provides the advantage of allowing the phase of a clock signal to be changed dynamically.

Techniques of the present invention provide circuits that can change the phase of a clock signal, while the PLL or DLL circuitry is ON and running. Circuits of the present invention do not need to be reset or reprogrammed to shift the phase of a clock signal. Also, circuits of the present invention can shift the phase of a clock signal without causing an unwanted glitch in the clock signal.

Figure 1:
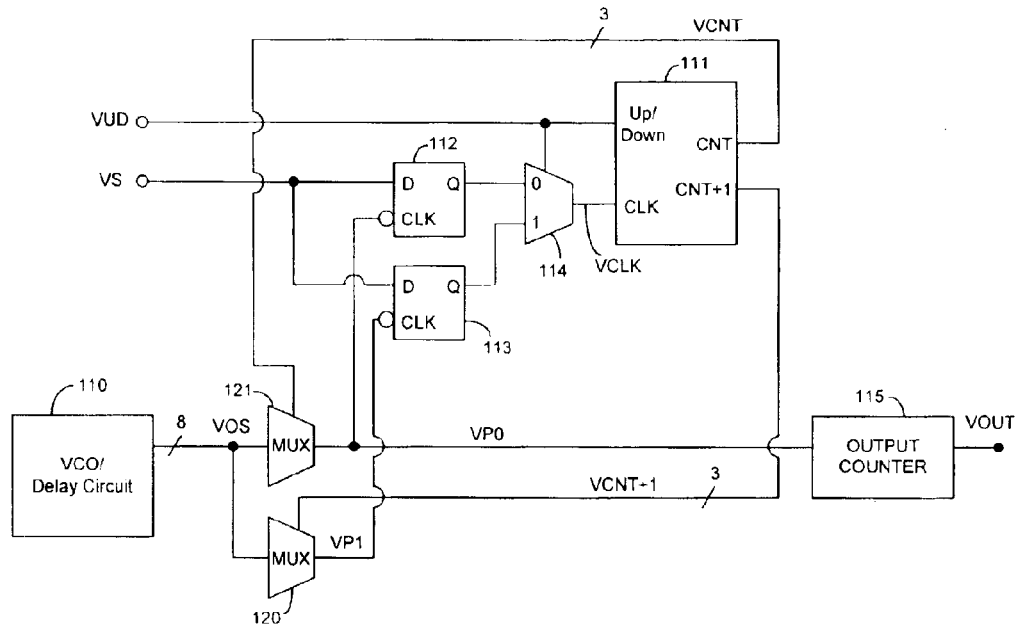
FIG. 1 is a block diagram of circuitry that can dynamically change the phase of a clock signal according to an embodiment of the present invention.

FIG. 1 illustrates an embodiment of the present invention. The circuitry of FIG. 1 can perform the clock signal phase selection techniques of the present invention. The techniques of the present invention can be implemented to shift the phase of clock signals generated by phase locked loops (PLLs) and clock signals generated by delay locked loops (DLLs).

Circuit 110 in FIG. 1 generates a plurality of periodic clock signals VOS. A PLL typically includes a voltage controlled oscillator (VCO) that generates clock signals. Circuit 110 can be, for example, voltage controlled oscillator (VCO) when the circuitry of FIG. 1 is used with a PLL. A typical VCO such as a ring oscillator such can generate a plurality of clock signals at the output of each stage in the loop.

A DLL typically includes an adjustable delay circuit such as a plurality of buffers coupled in series. The adjustable delay circuit delays the input clock signal by one period to generate the output clock signal. In the case of a DLL, circuit 110 is a delay circuit. Each clock signal is generated by one of the buffers in the DLL delay circuit.

Circuit 110 can generate any suitable number N of clock signals. As an example, circuit 110 generates 8 clock signals in the embodiment of FIG. 1 (N=8). Whether circuit 110 is a VCO in a PLL or a delay circuit in a DLL, the clock signals are offset in phase by 360°/N as shown in FIG. 2.

Figure 2:
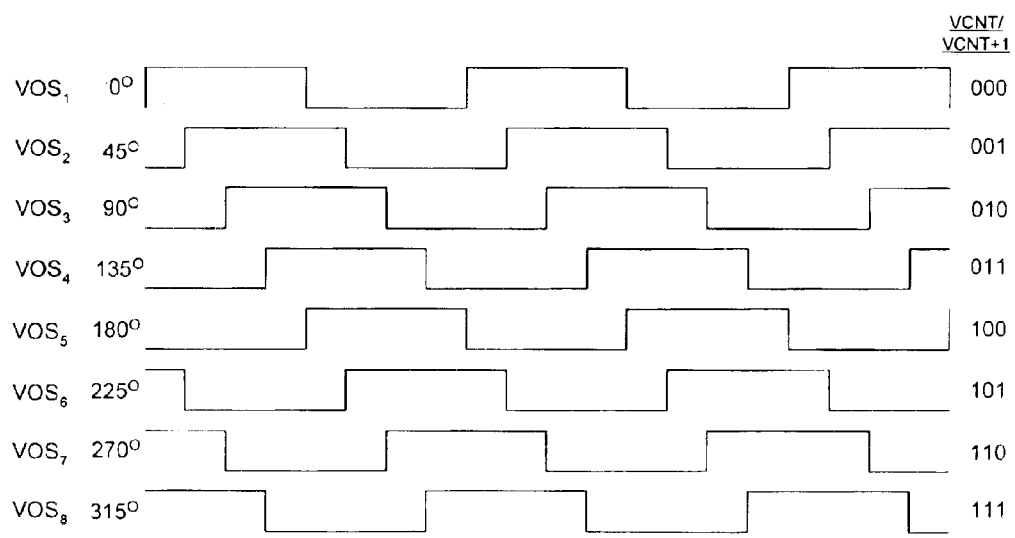
FIG. 2 is a timing diagram of a plurality of clock signals, each with different phases, according to the present invention.

FIG. 2 is a timing diagram of the eight clock signals VOS generated by circuit 110. Each of the eight clock signals VOS has the same period and the same duty cycle. However, each of the clock signals VOS has a different phase with respect to each of the other clock signals. As shown in FIG. 2, the phases of clock signals VOS are offset with respect to each other by multiples of 45 degrees (360°/8).

For example, each clock signal in FIG. 2 is shifted forward in time by 45 degrees with respect to the previous clock signal VOS (one-eight of a period). The phase offset of 45 degrees in the example of FIG. 2 was chosen merely for illustrative purposes and is not intended to limit the scope of the present invention. Any suitable phase offset value between the clock signals generated by circuit 110 can be chosen.

The inputs of multiplexers 120 and 121 are coupled to the outputs of circuit 110. Multiplexer 121 selects one of the eight clock signals VOS and passes the selected signal to its output as signal VP0. Multiplexer 121 receives signal VCNT at its select input. Select signal VCNT determines which clock signal VOS multiplexer 121 passes to its output.

Select signals VCNT have eight digitally encoded binary vales provided on three signal lines. These eight binary values are illustrated in FIG. 2. The binary value of signals VCNT determines which clock signal VOS multiplexer 121 selects. For example, if VCNT is 000, multiplexer 121 selects clock signal $VOS_1$. If VCNT is 100, multiplexer 121 selects clock signal $VOS_5$.

Output counter 115 receives signal VP0 from multiplexer 121 and generates output signal VOUT. VOUT is the output clock signal. Output counter 115 can include a frequency divider that reduces the frequency of VP0 by a fractional value (e.g., 1/10) to generate VOUT.

Multiplexer 120 also selects one of the eight clock signals VOS and passes the selected signal to its output as signal VP1. Multiplexer 120 receives signals VCNT+1 at its select input. Signals VCNT+1 also have eight digitally encoded binary values as shown in FIG. 2. The binary value of select signals VCNT+1 determines which clock signal VOS multiplexer 120 passes as its output signal VP1.

The binary value of signal VCNT+1 is always greater than the binary value of signal VCNT by 1, as will be discussed below. Therefore, output signal VP1 is always offset by 45 degrees with respect to output signal VP0.

Counter circuit 111 generates binary count signals VCNT and VCNT+1. The up/down input of counter 111 is coupled to receive up/down signal VUD. The clock input CLK of counter 111 is coupled to the output of multiplexer 114. Multiplexer 114 receives input signals from the Q outputs of D flip-flops 112 and 113. The D inputs of flip-flops 112–113 are coupled to receive strobe signal VS. The CLK input of flip-flop 112 is coupled to receive signal VP0 from multiplexer 121. The CLK input of flip-flop 113 is coupled to receive signal VP1.

When signal VUD is HIGH, counter circuit 111 increases the binary value of VCNT and VCNT+1 by one on each rising edge of clock signal VCLK from multiplexer 114. When signal VUD is LOW, counter circuit 111 decreases the binary value of VCNT and VCNT+1 by one on each rising edge of clock signal VCLK.

Figure 3:
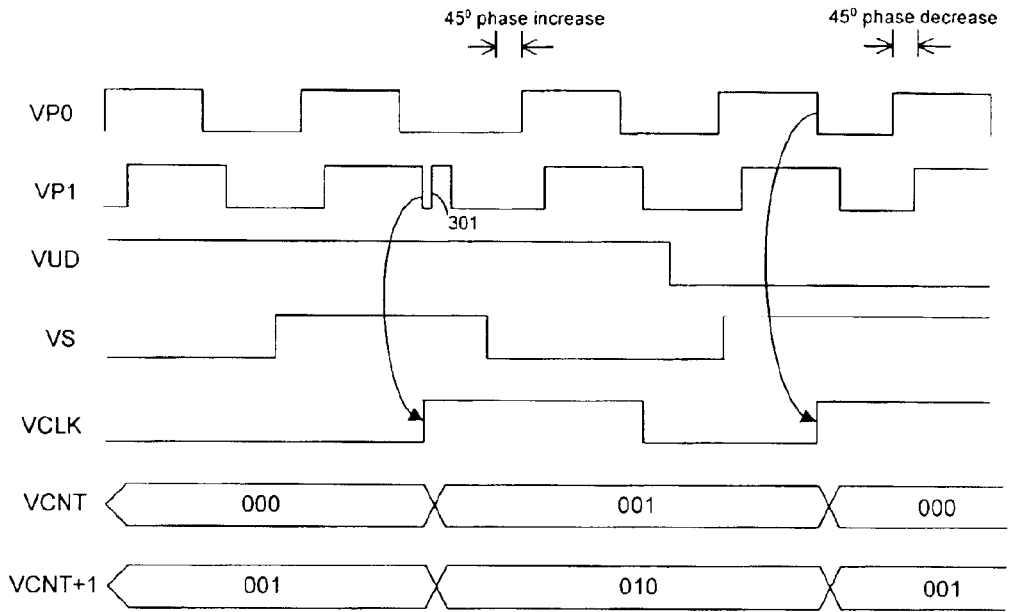
FIG. 3 is a timing diagram that shows changes in internal signals within the circuitry of FIG. 1 during operation.

FIG. 3 is a timing diagram that illustrates the relationship between signals shown in FIG. 1. In FIG. 3, signal VP0 is 45 degrees out of phase with signal VP1.

A user or external circuitry (e.g., in a PLL or DLL) causes the strobe signal VS to transition HIGH to change the phase of the output clock signal VOUT. Each rising edge of the strobe signal VS causes the phase of output signal VOUT to increase by an incremental value (e.g., 45°) if VUD is HIGH. Each rising edge of VS causes the phase of output signal VOUT to decrease by an incremental value (e.g., 45°) if VUD is LOW.

Referring to FIG. 3, signal VUD is initially HIGH, and strobe signal VS and control clock signal VCLK are both LOW initially. When VUD is HIGH, multiplexer 114 passes the Q output signal of flip-flop 113 to the CLK input of counter 111 and blocks the Q output of flip-flop 112.

Flip-flop 113 is driven by a falling edge at its CLK input. Thus, the Q output signal of flip-flop 113 goes HIGH the next time that VP1 transitions LOW after the first rising edge of VS. VCLK then transitions HIGH as shown in FIG. 3, triggering the CLK input of counter 111.

On a rising edge of VCLK, counter 111 increases the binary values of VCNT and VCNT+1 by one as shown in FIG. 3, because VUD is HIGH. When VCNT increases by one, multiplexer 121 increases the phase of VP0 by 45 degrees. The edges of VP0 now occur 45 degrees later in time as shown in FIG. 3. When VCNT+1 increases by one, multiplexer 120 increases the phase of VP1 by 45 degrees. The edges of VP1 now occur 45 degrees later in time as shown in FIG. 3.

Thus, when a user wants to increase the phase of VOUT by an incremental value (e.g., 45°), the circuitry of FIG. 1 synchronizes the phase increase with an edge of the VP1 signal. This synchronization is performed by enabling flip-flop 113 to trigger the CLK input of counter 111 through multiplexer 114.

A phase increase is synchronized with the VP1 signal to eliminate the effects of glitches on the output clock signal VOUT. When multiplexer 120 increases the phase of signal VP1 by selecting a different output of circuit 110, a glitch 301 can form in signal VP1, as shown in FIG. 3. Glitch 301 is an unwanted spurious downward pulse in clock signal VP1 that develops when multiplexer 120 selects a different signal near an edge of the currently selected signal. If VP1 drove output counter 115, VOUT would also have a glitch.

Because a phase increase is synchronized with a falling edge of VP1, the phase increase is not synchronized with an edge of VP0. Thus, the phase increase does not coincide with an edge of VP0. Therefore, VP0 and VOUT do not develop an unwanted glitch. According to various embodiments of the present invention, a phase increase (or decrease) can be synchronized with a rising or a falling edge of VP1, the output signal of multiplexer 120.

When strobe signal VS transitions LOW, VCLK also transitions LOW on the next falling edge of VP1.

When the user wants to decrease the phase of VOUT by an incremental value, the Up/Down signal VUD is pulled LOW as shown in FIG. 3. The user then pulls strobe signal VS HIGH each time the user wants to decrease the phase of VOUT by the incremental value. When VUD is LOW, multiplexer 114 selects the Q output of flip-flop 112 to activate the CLK input of counter 111 and blocks the Q output of flip-flop 113.

Flip-flop 112 is driven by a falling edge at its CLK input. Thus, the Q output signal of flip-flop 112 goes HIGH when VP0 transitions LOW after the next rising edge of VS. VCLK then transitions HIGH as shown in FIG. 3, triggering the CLK input of counter 111. Because VUD is LOW, counter 111 decreases the binary values of VCNT and VCNT+1 by one in response to a rising edge at the CLK input, as shown in FIG. 3.

When VCNT decreases by one, multiplexer 121 decreases the phase of VP0 by 45 degrees. The edges of VP0 now occur 45 degrees earlier in time as shown in FIG. 3. When VCNT+1 decreases by one, multiplexer 120 decreases the phase of VP1 by 45 degrees. The edges of VP1 now occur 45 degrees earlier in time as shown in FIG. 3.

Thus, when a user wants to decrease the phase of VOUT by an incremental value (e.g., 45°), the circuitry of FIG. 1 synchronizes the phase decrease with an edge of the VP0 signal. This synchronization is performed by enabling flip-flop 112 to trigger the CLK input of counter 111 through multiplexer 114.

Multiplexer 121 decreases the phase of signal VP0 by selecting a different output of circuit 110. The decrease in the phase of VP0 occurs on the falling edge of VP0. The newly selected clock signal VOS is already LOW, because its falling edge occurs 45 degrees sooner than the previously selected VOS signal. Therefore, a glitch does not form in signal VP0 as shown in FIG. 3.

The circuitry of FIG. 1 can also be used to change the frequency of a clock signal by a fractional value 1/M, where M is not limited to being a whole number value. For example, output counter 115 can divide the frequency of VP0 by 10, so that VOUT has one-tenth the frequency of VP0. The circuitry of FIG. 1 can be used to decrease the phase of VP0 by 45° (one-eighth of a clock period) four times out of every ten cycles. The output clock VOUT then has a frequency that equals 1/(9.5) times the frequency of VOS. In this example, M=9.5, which is not a whole number. Thus, the present invention increases the range of fractional values that a clock frequency can be divided by.

Figure 4:
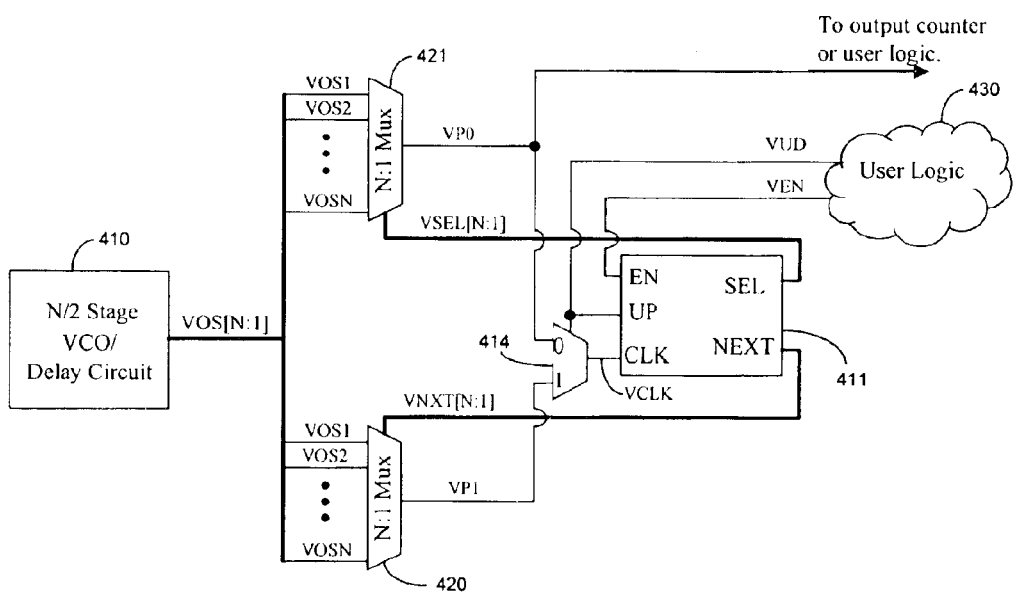
FIG. 4 is a block diagram of circuitry that can dynamically change the phase of a clock signal according to another embodiment of the present invention.

FIG. 4 illustrates another structural embodiment of the present invention. The circuitry shown in FIG. 4 is generalized to show that the phase of a periodic clock signal can be shifted by any fraction of its period (i.e., 0°–360°). Circuit 410 can generate any number N of clock signals VOS[N:1]. Circuit 410 can be a VCO in a PLL or an adjustable delay circuit in a DLL. The clock signals VOS have the same period and duty cycle. The phase of each clock signal VOS is offset by a fraction 360°/N of the clock period.

Multiplexer 421 passes one of the clock signals VOS to multiplexer 414 and to an output counter (or user logic or feedback counter) as signal VP0. Multiplexer 420 also passes one of clock signals VOS to multiplexer 414 as signal VP1. The phase of signal VP0 is offset by 360°/N with respect to signal VP1.

Phase shift circuit 411 receives three input signals: VUD, VEN, and VCLK. VUD is the up/down signal that determines whether the phases of VP0 and VP1 are increased or decreased as discussed above with respect to FIG. 1. VCLK is the output signal of multiplexer 414, which triggers the CLK input of circuit 411. When VUD is HIGH, multiplexer 414 passes VP1 to the CLK input of circuit 411. When VUD is LOW, multiplexer 414 passes VP0 to the CLK input of circuit 411.

VEN is an enable signal. Both VUD and VEN are generated by user logic 430. VEN replaces the strobe signal VS. VEN is supplied to an enable input of circuit 411. Circuit 411 generates select signals VSEL[N:1] and VNXT[N:1]. When VEN is LOW, signals VSEL and VNXT do not change on a rising or falling edge of VCLK.

Only one of the N signals VSEL[N:1] is HIGH at once. The VSEL[N:1] signal that is HIGH determines which clock signal VOS[N:1] multiplexer 421 selects. Only one of N signals VNXT[N:1] is HIGH at once. The VNXT[N:1] signal that is HIGH determines which clock signal VOS [N:1] multiplexer 420 selects.

If VEN and VUD are HIGH, the HIGH signals of VSEL [N:1] and VNXT[N:1] shift by one position in a first direction on a rising edge of VCLK. If VEN is HIGH and VUD is LOW, the HIGH signals of VSEL[N:1] and VNXT [N:1] shift by one position in a second direction on a rising edge of VCLK.

When the HIGH signals of VSEL and VNXT shift in the first direction, multiplexers 420 and 421 increase the phases of signals VP1 and VP0, respectively, by the incremental phase value 360°/N. When the HIGH signals of VSEL and VNXT shift in the second direction, multiplexers 420 and 421 decrease the phases of signals VP1 and VP0, respectively, by the incremental phase value 360°/N.

As in the embodiment of FIG. 1, increases in the phase of VP0 and VP1 are synchronized to an edge of VP1 so that any glitches caused by the phase increase appear in VP1 and not VP0.

Figure 5:
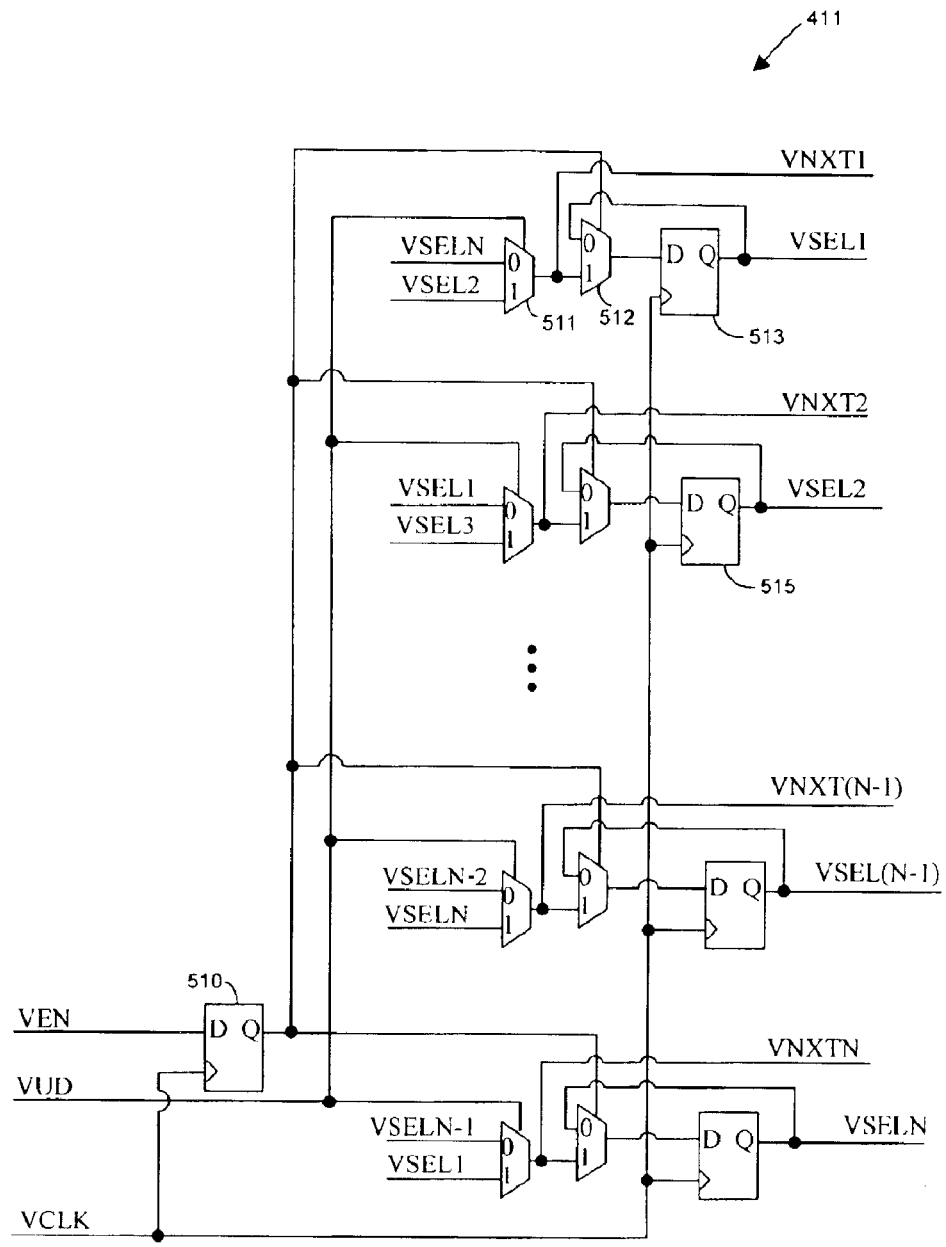
FIG. 5 is a block diagram illustrating an embodiment of a cyclic shift register of the present invention that can be used in the embodiment of FIG. 4.

FIG. 5 illustrates one possible embodiment of circuit 411 according to the present invention. In the embodiment of FIG. 5, phase shift circuit 411 is a cyclic shift register. The present invention also includes other embodiments of phase shift circuit 411 such as the up/down counter circuit of FIG. 1 with a decoder.

Referring to FIG. 5, when the up/down signal VUD is HIGH, multiplexer 511 selects VSEL2. When VUD is LOW, multiplexer 511 selects VSELN. The output signal of multiplexer 511 is VNXT1.

When enable signal VEN is HIGH, the Q output signal of flip-flop 510 transitions HIGH on a rising edge of VCLK, which causes multiplexer 512 to select the output signal of multiplexer 511 and pass it to the D input of flip-flop 513. If VUD is HIGH, on the rising edge of signal VCLK, flip-flop 513 passes signal VSEL2 to signal VSEL1. Similarly, flip-flop 515 passes signal VSEL3 to signal VSEL2 when VCLK goes HIGH. The other output D flip-flops perform the same function on higher bits in VSEL. Thus, when VCLK goes HIGH and VUD is HIGH, the HIGH signal of VSEL moves down by one bit position, causing multiplexer 421 to increase the phase of VP0 by 360°/N. VSEL1 is the least significant bit of the count signal VSEL[N:1]. VSELN is the most significant bit of the count signal VSEL.

If VUD is LOW, flip-flop 513 passes signal VSELN as output signal VSEL1, and flip-flop 515 passes signal VSEL1 as output signal VSEL2. Thus, when VCLK goes HIGH and VUD is LOW, the one HIGH signal of VSEL moves up by one bit position, causing multiplexer 421 to decrease the phase of VP0 by 360°/N.

When VUD is HIGH, the one HIGH signal of VNXT is shifted down by one bit position, causing multiplexer 420 to increase the phase of VP1 by 360°/N. When VUD is LOW, the one HIGH signal of VNXT is shifted up by one bit position, causing multiplexer 421 to decrease the phase of VP1 by 360°/N.

When VEN is LOW, counter 411 is disabled, because multiplexer 512 feeds back signal VSEL1 into the D input of flip-flop 513. Thus, signal VSEL1 holds state. Signals VSEL[2:N} and VNXT[1:N] also hold state when VEN is LOW.

Techniques of the present invention for dynamically shifting the phase of a clock signal can be implemented in phase locked loops (PLLs) and delay locked loops (DLLs). PLLs and DLLs are typically used in programmable integrated circuits to maintains a specific phase relationship between the master clock and the internal clock, as discussed above. Examples of programmable integrated circuits include programmable logic devices (PLDs), field programmable gate arrays (FPGAs), programmable logic arrays (PLAs), configurable PLDs, configurable gate arrays, etc.

Figure 6:
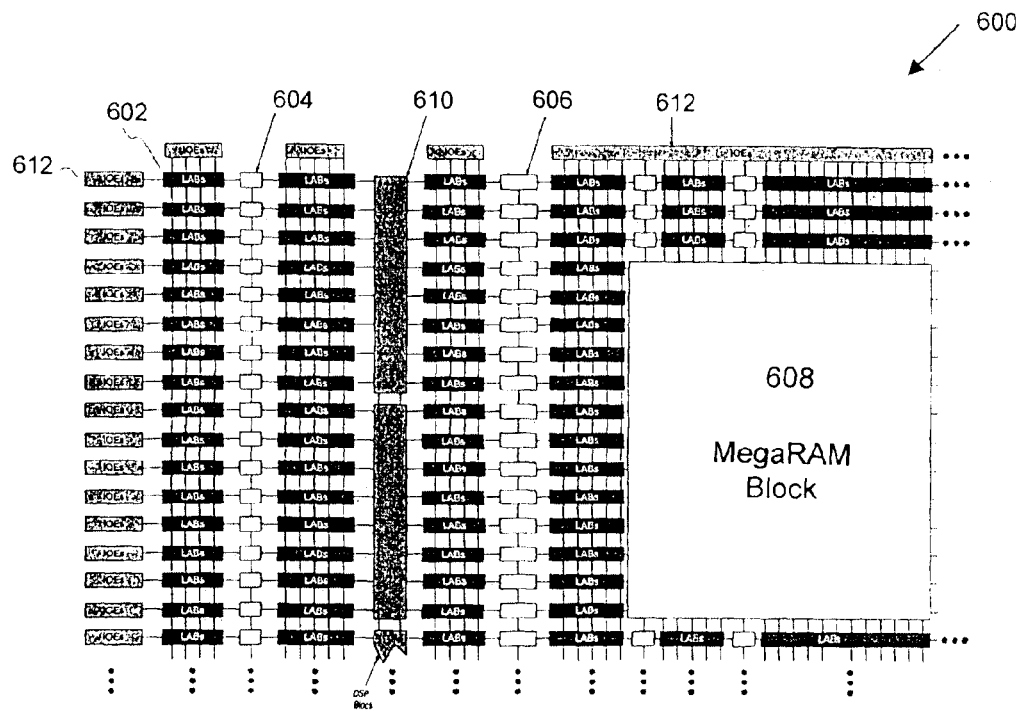
FIG. 6 is a simplified block diagram of a programmable logic device that can implement embodiments of the present invention.

FIG. 6 is a simplified partial block diagram of an exemplary high-density PLD 600. Techniques of the present invention can be utilized in a PLD such as PLD 600. PLD 600 includes a two-dimensional array of programmable logic array blocks (or LABs) 602 that are interconnected by a network of column and row interconnects of varying length and speed. LABs 602 include multiple (e.g., 10) logic elements (or LEs). An LE is a small unit of logic that provides for efficient implementation of user defined logic functions.

PLD 600 also includes a distributed memory structure including RAM blocks of varying sizes provided throughout the array. The RAM blocks include, for example, 512 bit blocks 604, 4K blocks 606 and a MegaBlock 608 providing 512K bits of RAM. These memory blocks can also include shift registers and FIFO buffers. PLD 600 further includes digital signal processing (DSP) blocks 610 that can implement, for example, multipliers with add or subtract features. I/O elements (IOEs) 612 located, in this example, around the periphery of the device support numerous single-ended and differential I/O standards. It is to be understood that PLD 600 is described herein for illustrative purposes only and that the present invention can be implemented in many different types of PLDs, FPGAs, and the like.

Figure 7:
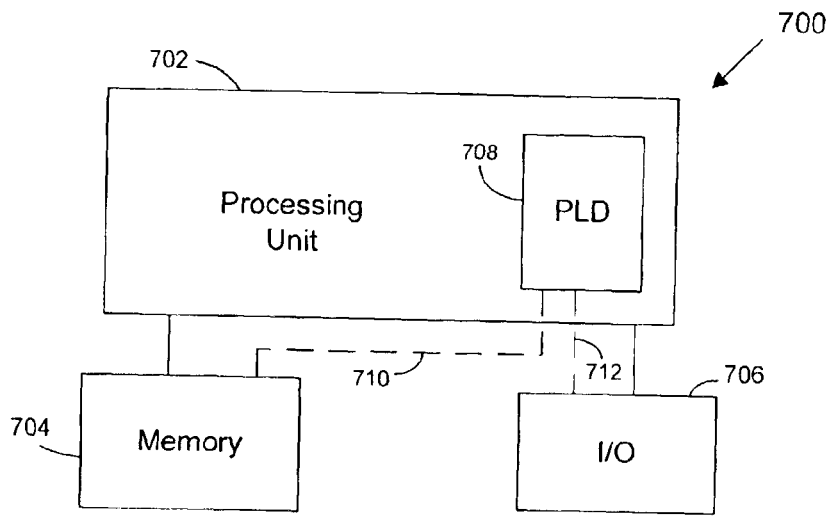
FIG. 7 is a block diagram of an electronic system that can implement embodiments of the present invention.

While PLDs of the type shown in FIG. 6 provide many of the resources required to implement system level solutions, the present invention can also benefit systems wherein a PLD is one of several components. FIG. 7 shows a block diagram of an exemplary digital system 700, within which the present invention can be embodied. System 700 can be a programmed digital computer system, digital signal processing system, specialized digital switching network, or other processing system. Moreover, such systems may be designed for a wide variety of applications such as telecommunications systems, automotive systems, control systems, consumer electronics, personal computers, Internet communications and networking, and others. Further, system 700 can be provided on a single board, on multiple boards, or within multiple enclosures.

System 700 includes a processing unit 702, a memory unit 704 and an I/O unit 706 interconnected together by one or more buses. According to this exemplary embodiment, a programmable logic device (PLD) 708 is embedded in processing unit 702. PLD 708 can serve many different purposes within the system in FIG. 7. PLD 708 can, for example, be a logical building block of processing unit 702, supporting its internal and external operations. PLD 708 is programmed to implement the logical functions necessary to carry on its particular role in system operation. PLD 708 may be specially coupled to memory 704 through connection 710 and to I/O unit 706 through connection 712.

Processing unit 702 can direct data to an appropriate system component for processing or storage, execute a program stored in memory 704 or receive and transmit data via I/O unit 706, or other similar function. Processing unit 702 can be a central processing unit (CPU), microprocessor, floating point coprocessor, graphics coprocessor, hardware controller, microcontroller, programmable logic device programmed for use as a controller, network controller, and the like.

Furthermore, in many embodiments, there is often no need for a CPU. For example, instead of a CPU, one or more PLDs 708 can control the logical operations of the system. In an embodiment, PLD 708 acts as a reconfigurable processor, which can be reprogrammed as needed to handle a particular computing task. Alternately, programmable logic device 708 can itself include an embedded microprocessor. Memory unit 704 can be a random access memory (RAM), read only memory (ROM), fixed or flexible disk media, PC Card flash disk memory, tape, or any other storage means, or any combination of these storage means.

While the present invention has been described herein with reference to particular embodiments thereof, a latitude of modification, various changes, and substitutions are intended in the present invention. In some instances, features of the invention can be employed without a corresponding use of other features, without departing from the scope of the invention as set forth. Therefore, many modifications may be made to adapt a particular configuration or method disclosed, without departing from the essential scope and spirit of the present invention. It is intended that the invention not be limited to the particular embodiment disclosed, but that the invention will include all embodiments and equivalents falling within the scope of the claims.

What is claimed is:

1. A method for changing a phase of a clock signal, the method comprising:
   generating N clock signals that each have a period, wherein each of the N clock signals has the same period and a different phase;
   selecting first and second ones of the N clock signals to provide a selected clock signal and a phase forward clock signal using selection circuits; and
   in response to an edge of a phase change signal, shifting the phase of the selected clock signal and the phase forward clock signal by causing the selection circuits to select different ones of the N clock signals,
   wherein the phases of the selected and phase forward clock signals remain constant until another edge of the phase change signal.

2. The method of claim 1 further comprising:
   dividing the frequency of the selected clock signal by a fractional value to generate an output clock signal, a frequency of the output clock signal being 1/M times the frequency of one of the N clock signals, wherein M is not a whole number.

3. The method of claim 1 further comprising:
   decreasing the phases of the selected clock signal and the phase forward clock signal, wherein each phase decrease of the selected clock signal is synchronized with an edge of the selected clock signal; and
   increasing the phase of the selected clock signal in response to a phase change signal, wherein each phase increase of the selected clock signal is synchronized with an edge of the phase forward clock signal.

4. The method of claim 3 wherein shifting the phases of the selected clock signal and the phase forward clock signal further comprises:

changing values of first and second select signals in response to the phase change signal;

selecting a different one of the N clock signals to shift the phase of the selected clock signal in response to the changed value of the first select signal; and selecting a different one of the N clock signals to shift the phase of the phase forward clock signal in response to the changed value of the second select signal.

5. The method of claim 4 wherein the first and the second select signals are count signals, the phase of the selected clock signal and the phase forward clock signal shifting forward by 360°/N when the first and the second select signals increase, the phase of the selected clock signal and the phase forward clock signal shifting backward by 360°/N when the first and the second select signals decrease.

6. The method of claim 4 wherein binary values of the first and the second select signals are shifted in one direction to increase the phases of the selected clock signal and the phase forward clock signal by 360°/N, and the binary values of the first and the second select signals are shifted in a second direction to decrease the phases of the selected clock signal and the phase forward clock signal by 360°/N.

7. A method for changing a phase of an output clock signal, the method comprising:

providing first and second clock signals having different phases;

in response to a phase change signal, shifting the phases of the first and the second clock signals backward on an edge of the first clock signal, wherein each decrease in phase of the first and second clock signals is synchronized with an edge of the first clock signal;

in response to the phase change signal, shifting the phases of the first and the second clock signals forward on an edge of the second clock signal, wherein each increase in phase of the first and second clock signals is synchronized with an edge of the second clock signal; and providing the first clock signal as the output signal.

8. The method of claim 7 further comprising:

generating N clock signals using an oscillator, phases of the N clock signals being separated by 360°/N, and a period of each of the N clock signals having the same length, wherein the first clock signal is selected from among the N clock signals using a first multiplexer, and the second clock signal is selected from among the N clock signals using a second multiplexer.

9. A method for changing a phase of an output clock signal, the method comprising:

providing first and second clock signals having different phases; second clock signals backward on an edge of the first clock signal;

in response to a phase change signal, shifting the phases of the first and the second clock signals backward on an edge of the first clock signal;

in response to the phase change signal, shifting the phases of the first and the second clock signals forward on an edge of the second clock signal; and providing the first clock signal as the output signal, wherein the phases of the first and the second clock signals are shifted backward when a directional signal is a first value, and the phases of the first and the second clock signals are shifted forward when the directional signal is a second value.

10. The method of claim 9 wherein:

shifting the phases of the first and the second clock signals forward and backward further comprises changing a value of first and second count signals in a direction indicated by the directional signal, providing the first count signal to the first multiplexer, and providing the second count signal to the second multiplexer.

11. The method of claim 9 wherein shifting the phases of the first and the second clock signals forward and backwards further comprises:

generating first digital select signals that indicate to the first multiplexer which of the N clock signals to select;

generating second digital select signals that indicate to the second multiplexer which of the N clock signals to select;

causing a HIGH signal within each of the first and the second count signals to shift to a different bit position in response to the phase change signal;

changing the phase of the first clock signal by selecting a different one of the N clock signals using the first multiplexer in response to changes in the first digital select signals; and changing the phase of the second clock signal by selecting a different one of the N clock signals using the second multiplexer in response to changes in the second digital select signals.

12. A phase shift selection circuit comprising:

a first multiplexer that selects one of N clock signals that have different phases to provide an output clock signal;

a second multiplexer that selects one of the N clock signals to provide a phase forward signal; and a storage circuit that dynamically shifts the phases of the output clock signal and the phase forward signal in response to a phase change signal by causing the first and the second multiplexers to select different ones of the N clock signals, wherein each shift in the phase of the output clock signal coincides with an edge of one of the phase forward and the output clock signals.

13. The phase shift selection circuit according to claim 12 further comprising:

a voltage controlled oscillator coupled to the first and the second multiplexers that generates the N clock signals.

14. The phase shift selection circuit according to claim 12 further comprising:

an adjustable delay circuit coupled to the first and the second multiplexers that generates the N clock signals.

15. The phase shift selection circuit according to claim 12 further comprising:

a frequency divider that divides the frequency of the output clock signal by a fractional value.

16. A phase shift selection circuit comprising:

a first multiplexer that selects one of N clock signals that have different phases to provide an output clock signal;

a second multiplexer that selects one of the N clock signals to provide a phase forward signal, a phase of the output clock signal being offset from a phase of the phase forward signal;

a phase shift selection circuit that dynamically shifts the phases of the output clock signal and the phase forward signal in response to a phase change signal by causing the first and the second multiplexers to select different ones of the N clock signals; and a third multiplexer that selectively couples the output clock signal and the phase forward signal to an input of the phase selection circuit.

17. A phase shift selection circuit comprising:

a first multiplexer that selects one of N clock signals that have different phases to provide an output clock signal;

a second multiplexer that selects one of the N clock signals to provide a phase forward signal, a phase of the output clock signal being offset from a phase of the phase forward signal by 360°/N; and a phase shift selection circuit that dynamically shifts the phases of the output clock signal and the phase forward signal by 360°/N in response to a phase change signal by causing the first and the second multiplexers to select different ones of the N clock signals, wherein the phase shift selection circuit increases the phases of the output clock signal and the phase forward signal by 360°/N on an edge of the phase forward signal when a directional signal is a first value, and the phase shift selection circuit decreases the phases of the output clock signal and the phase forward signal by 360°/N on an edge of the output clock signal when the directional signal is a second value.

18. A phase shift selection circuit comprising:
a first multiplexer that selects one of N clock signals that have different phases to provide an output clock signal;
a second multiplexer that selects one of the N clock signals to provide a phase forward signal, a phase of the output clock signal being offset from a phase of the phase forward signal; and
a phase shift selection circuit that dynamically shifts the phases of the output clock signal and the phase forward signal in response to a phase change signal by causing the first and the second multiplexers to select different ones of the N clock signals
wherein the phase shift selection circuit is a counter circuit that generates first and second count signals that control the first and the second multiplexers, respectively, values of the first and the second count signals changing in response to the phase change signal.

19. A phase shift selection circuit comprising:
a first multiplexer that selects one of N clock signals that have different phases to provide an output clock signal;
a second multiplexer that selects one of the N clock signals to provide a phase forward signal, a phase of the output clock signal being offset from a phase of the phase forward signal;
a phase shift selection circuit that dynamically shifts the phases of the output clock signal and the phase forward signal in response to a phase change signal by causing the first and the second multiplexers to select different ones of the N clock signals,
wherein the phase shift selection circuit is a cyclic shift register that generates a first set and a second set of digital signals that control the first and the second multiplexers, respectively, values of the first and the second sets of digital signals shifting in response to the phase change signal.

20. A phase shift selection circuit comprising:
a first multiplexer that selects one of a plurality of clock signals to provide an output clock signal, each of the clock signals having a different phase;
a second multiplexer that selects one of the clock signals to provide a phase forward clock signal; and
a multiplexer control circuit that decreases phases of the output and the phase forward clock signals on an edge of the output clock signal, and increases the phases of the output and the phase forward clock signals on an edge of the phase forward clock signal in response to a phase change signal, wherein each increase in the phase of the output clock signal coincides with an edge of the phase forward clock signal.

21. The phase shift selection circuit of claim 20 further comprising:
an oscillator coupled to the first and the second multiplexers that generates the clock signals.

22. The phase shift selection circuit of claim 20 further comprising:
a delay circuit coupled to the first and the second multiplexers that generates the clock signals.

23. The phase shift selection circuit of claim 20 wherein the multiplexer control circuit is a counter circuit that generates a first count signal at the first output and a second count signal at the second output, the first and the second count signals changing in response to the phase change signal.

24. The phase shift selection circuit of claim 20 further comprising:
an output counter circuit that divides the frequency of the output clock signal by a fractional value.

25. The phase shift selection circuit of claim 20 wherein the multiplexer control circuit is a cyclic shift register that generates first and second sets of digital signals, values of the first and the second sets of digital signals shifting in response to the phase change signal.

26. The phase shift selection circuit of claim 20 further comprising:
a third multiplexer coupled to receive the output clock signal and the phase forward clock signal from the first and the second multiplexers, the third multiplexer having an output coupled to an input of the multiplexer selection circuit.

27. The phase shift selection circuit of claim 20 wherein the multiplexer control circuit decreases the phases of the output and the phase forward clock signals when a phase direction signal is a first value, and the multiplexer control circuit increases the phases of the output and the phase forward clock signals when the phase direction signal is a second value.

28. A method for changing a phase of a clock signal, the method comprising:
generating N clock signals that each have a period, wherein each of the N clock signals has the same period and a different phase;
selecting a first one of the N clock signals to provide a selected clock signal;
selecting a second one of the N clock signals to provide a phase forward clock signal; and
in response to a phase change signal, increasing the phase of the selected clock signal by selecting a different one of the N clock signals, wherein each increase in the phase of the selected clock signal coincides with an edge of the phase forward clock signal.

29. A delay locked loop circuit comprising:
a delay circuit that generates N clock signals that have different phases;
a first multiplexer coupled to the delay circuit that selects one of the N clock signals to provide an output clock signal;
a second multiplexer coupled to the delay circuit that selects one of the N clock signals to provide a phase forward signal, a phase of the output clock signal being offset from a phase of the phase forward signal by 360°/N; and
a phase shift selection circuit that dynamically shifts the phases of the output clock signal and the phase forward signal by 360°/N in response to an edge of a phase change signal by causing the first and the second multiplexers to select different ones of the N clock signals, wherein the phases of the output clock signal and phase forward signal remain constant until another edge of the phase change signal.

30. The delay locked loop circuit of claim 29 wherein the phase shift selection circuit is a counter circuit that generates first and second count signals that control the first and the second multiplexers, respectively, values of the first and the second count signals changing in response to the phase change signal.

31. The delay locked loop circuit of claim 29 wherein the phase shift selection circuit is a cyclic shift register that generates a first set and a second set of digital signals that control the first and the second multiplexers, respectively, values of the first and the second sets of digital signals shifting in response to the phase change signal.

32. A phase locked loop circuit comprising:

an oscillator that generates N clock signals that have different phases;

a first multiplexer coupled to the oscillator that selects one of the N clock signals to provide an output clock signal;

a second multiplexer coupled to the oscillator that selects one of the N clock signals to provide a phase forward signal, a phase of the output clock signal being offset from a phase of the phase forward signal;

a phase shift selection circuit that dynamically shifts the phases of the output clock signal and the phase forward signal in response to a phase change signal by causing the first and the second multiplexers to select different ones of the N clock signals, wherein each increase in the phase of the output clock signal is synchronized with an edge of the phase forward signal.

33. The phase locked loop circuit of claim 32 wherein the phase shift selection circuit increases the phases of the output clock signal and the phase forward signal by 360°/N on an edge of the phase forward signal when a directional signal is a first value, and the phase shift selection circuit decreases the phases of the output clock signal and the phase forward signal by 360°/N on an edge of the output clock signal when the directional signal is a second value.

* * * * *